(12) United States Patent
Wang et al.

(10) Patent No.: US 12,484,315 B2
(45) Date of Patent: Nov. 25, 2025

(54) SOLAR-BLIND AlGaN ULTRAVIOLET PHOTODETECTOR AND PREPARATION METHOD THEREOF

(71) Applicant: SOUTH CHINA UNIVERSITY OF TECHNOLOGY, Guangzhou (CN)

(72) Inventors: Wenliang Wang, Guangzhou (CN); Linhao Li, Guangzhou (CN); Guoqiang Li, Guangzhou (CN); Hongsheng Jiang, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 25 days.

(21) Appl. No.: 18/245,943

(22) PCT Filed: Jan. 25, 2022

(86) PCT No.: PCT/CN2022/073829
§ 371 (c)(1),
(2) Date: Mar. 20, 2023

(87) PCT Pub. No.: WO2023/092856
PCT Pub. Date: Jun. 1, 2023

(65) Prior Publication Data
US 2024/0355952 A1 Oct. 24, 2024

(30) Foreign Application Priority Data
Nov. 24, 2021 (CN) .......................... 202111406118.0

(51) Int. Cl.
*H10F 30/227* (2025.01)
*H10F 71/00* (2025.01)
*H10F 77/124* (2025.01)

(52) U.S. Cl.
CPC ....... *H10F 30/227* (2025.01); *H10F 71/1274* (2025.01); *H10F 77/12485* (2025.01)

(58) Field of Classification Search
CPC .... H10F 30/227; H10F 71/1274; H10F 71/00; H10F 71/1278; H10F 71/1276;
(Continued)

(56) References Cited

U.S. PATENT DOCUMENTS

| 2002/0074553 | A1* | 6/2002 | Starikov | ............. H10F 71/1276 257/77 |
| 2007/0077745 | A1* | 4/2007 | He | ....................... H10D 30/475 257/E21.441 |
| 2009/0134403 | A1 | 5/2009 | Koide | |

FOREIGN PATENT DOCUMENTS

| CN | 103762264 | | 4/2014 |
| CN | 207925473 U | * | 9/2018 |

(Continued)

OTHER PUBLICATIONS

Y. Z. Chiou, Y. C. Lin and C. K. Wang, "AlGaN Photodetectors Prepared on Si Substrates," in IEEE Electron Device Letters, vol. 28, No. 4, pp. 264-266, Apr. 2007, doi: 10.1109/LED.2007.893224 (Year: 2007).*

(Continued)

*Primary Examiner* — Sitaramarao S Yechuri
(74) *Attorney, Agent, or Firm* — JMB Davis Ben-David

(57) ABSTRACT

The present invention discloses a solar-blind AlGaN ultraviolet (UV) photodetector and a preparation method thereof. The solar-blind AlGaN UV photodetector comprises an UV photodetector epitaxial wafer, including an undoped N-polar plane AlN buffer layer, a carbon-doped N-polar plane AlN layer, a carbon-doped N-polar plane composition-graded $Al_yGa_{1-y}N$ layer, and an undoped N-polar plane $Al_xGa_{1-x}N$ layer that are grown sequentially on a silicon substrate, and also comprises an insulating layer, an ohmic contact electrode, and a Schottky contact electrode arranged on the UV photodetector epitaxial wafer, as well as a $SiN_z$ passivation layer arranged on both sides of the UV photodetector
(Continued)

epitaxial wafer, where x=0.5-0.8, y=0.75-0.95, and z=1.33-1.5. The present invention realizes the preparation of the high-performance solar-blind AlGaN UV photodetector, and improves the responsivity and detectivity of the AlGaN UV photodetector' in the UV solar-blind band.

10 Claims, 2 Drawing Sheets

(58) Field of Classification Search
CPC ........... H10F 77/12485; H10F 77/1246; H10F 77/16; H10F 77/20; H10F 77/206; H10F 77/306; Y02P 70/50; H01L 21/02381; H01L 21/0254; H01L 21/0262
See application file for complete search history.

(56) References Cited

FOREIGN PATENT DOCUMENTS

| | | | |
|---|---|---|---|
| CN | 111564511 | | 8/2020 |
| CN | 113097315 | | 7/2021 |
| DE | 102013113227 | | 6/2015 |
| JP | 2003023175 A | * | 1/2003 |
| KR | 20060112428 | | 11/2006 |

OTHER PUBLICATIONS

R. S. Pokharia et al., "A Highly Sensitive and Robust GaN Ultraviolet Photodetector Fabricated on 150-mm Si (111) Wafer," in IEEE Transactions on Electron Devices, vol. 68, No. 6, pp. 2796-2803, Jun. 2021, doi: 10.1109/TED.2021.3073650 (Year: 2021).*

* cited by examiner

SOLAR-BLIND AlGaN ULTRAVIOLET PHOTODETECTOR AND PREPARATION METHOD THEREOF

CROSS-REFERENCE TO RELATED APPLICATION

This is the U.S. National Stage of International Patent Application No. PCT/CN2022/073829 filed on Jan. 25, 2022, which claims priority to China Patent Application No. 202111406118.0 filed on Nov. 24, 2021.

FIELD OF THE INVENTION

The present invention relates to an ultraviolet (UV) photodetector, in particular to a solar-blind AlGaN UV photodetector and a preparation method thereof.

BACKGROUND OF THE INVENTION

As an optoelectronic component playing an important role in national defense early warning, meteorological monitoring, communication support, and other fields, UV photodetectors have attracted much attention from all walks of life. Traditional GaN-based UV photodetectors have disadvantages such as narrow band gap and low electron saturation mobility, which result in narrow response frequency bands, weak filtering of visible light, serious device heating, poor stability, and other problems, so it is difficult for the GaN-based UV photodetectors to meet the increasing demands for device miniaturization, integration, and shorter wavelengths. Therefore, it is urgent to develop a new generation of UV photoelectric devices that can be applied to 260 nm wavelength working conditions and meanwhile meet the requirements of device miniaturization and integration applications. The research on UV photodetectors of group III nitride compounds represented by AlGaN has arisen. In addition, due to the introduction of MXene, on the one hand, a Schottky contact is formed with AlGaN, and a Schottky heterojunction is formed; and on the other hand, the higher electron mobility and stability of MXene endow AlGaN UV photodetectors with better photoelectron transmission capability, as well as better separation and photoelectron collection capability of photogenerated electron-hole pairs. These characteristics endow the AlGaN-based UV photodetectors with broader application prospects and higher performance stability in the application field of solar-blind photodetectors at shorter wavelengths. Therefore, the exploration of the solar-blind AlGaN UV photodetectors and their realization methods has pioneering revolutionary significance and social application value.

SUMMARY OF THE INVENTION

In view of the above, the present invention provides a solar-blind AlGaN UV photodetector and a preparation method thereof. The preparation method achieves a high-performance solar-blind AlGaN UV photodetector, not only improving the responsivity and detectivity of the AlGaN UV photodetector in the UV solar-blind band, but also having the advantages of high matching with the existing production methods and easy implementation.

A first object of the present invention is to provide a solar-blind AlGaN UV photodetector.

A second object of the present invention is to provide a method for preparing the solar-blind AlGaN UV photodetector.

The first object of the present invention can be achieved through the follow technical solution:

A solar-blind AlGaN UV photodetector is provided, comprising an UV photodetector epitaxial wafer, and also an insulating layer, an ohmic contact electrode, and a Schottky contact electrode arranged on the UV photodetector epitaxial wafer, as well as a $SiN_z$ passivation layer arranged on both sides of the UV photodetector epitaxial wafer, where z=1.33-1.5; wherein:

the UV photodetector epitaxial wafer comprises the following layers grown sequentially on a silicon substrate: an undoped N-polar plane AlN buffer layer, a carbon-doped N-polar plane AlN layer, a carbon-doped N-polar plane composition-graded $Al_yGa_{1-y}N$ layer, and an undoped N-polar plane $Al_xGa_{1-x}N$ layer, where x=0.5-0.8, and y=0.75-0.95; and the insulating layer is arranged on one side of the undoped N-polar plane $Al_xGa_{1-x}N$ layer; the ohmic contact electrode is arranged on the insulating layer, and also oppositely on the upper surface of the undoped N-polar plane $Al_xGa_{1-x}N$ layer; and the Schottky contact electrode is arranged on the ohmic contact electrode, on the side surface of the insulating layer and the ohmic contact electrode, and on the undoped N-polar plane $Al_xGa_{1-x}N$ layer.

Further, the Schottky contact electrode is made of a two-dimensional MXene material, and the insulating layer is made of $Al_2O_3$.

Further, the thickness of the insulating layer is 200-300 nm, and the thickness of the ohmic contact electrode is 100-150 nm.

Further, the insulating layer is higher than the upper surface of the undoped N-polar plane $Al_xGa_{1-x}N$ layer.

Further, the close-packed (111) surface of the silicon substrate is taken as the epitaxial surface; and (0001) is taken as the epitaxial direction for the undoped N-polar plane AlN buffer layer, the carbon-doped N-polar plane AlN layer, the carbon-doped N-polar plane composition-graded $Al_yGa_{1-y}N$ layer, and the undoped N-polar plane $Al_xGa_{1-x}N$ layer.

The second object of the present invention can be achieved through the follow technical solution:

A method for preparing the solar-blind AlGaN UV photodetector is provided, comprising the following steps:

growing the following layers sequentially on the silicon substrate: an undoped N-polar plane AlN buffer layer, a carbon-doped N-polar plane AlN layer, a carbon-doped N-polar plane composition-graded $Al_yGa_{1-y}N$ layer, and an undoped N-polar plane $Al_xGa_{1-x}N$ layer, where x=0.5-0.8, and y=0.75-0.95, thus obtaining an UV photodetector epitaxial wafer, and then processing the wafer;

performing photolithography on the processed UV photodetector epitaxial wafer to obtain an isolation pattern, then etching the UV photodetector epitaxial wafer to obtain a groove along the isolation pattern, and then placing the UV photodetector epitaxial wafer in a plasma-assisted chemical vapor deposition device to deposit a $SiN_z$ passivation layer in the groove, where z=1.33-1.5;

etching the exposed $SiN_z$ on the UV photodetector epitaxial wafer away by a wet etching method, and then processing the wafer;

performing photolithography on one side of the undoped N-polar plane $Al_xGa_{1-x}N$ layer through mask alignment to obtain an insulating layer pattern thereon, then placing the UV photodetector epitaxial wafer in an electron beam evaporation device to evaporation-deposit an isolating layer thereon, and then processing the UV photodetector epitaxial wafer with the prepared insulating layer;

performing photolithography on the insulating layer and oppositely on the undoped N-polar plane $Al_xGa_{1-x}N$ layer through mask alignment, respectively, thus obtaining the pattern of the ohmic contact electrode; then placing the UV photodetector epitaxial wafer in the electron beam evaporation device to evaporation-deposit an ohmic contact electrode metal, thus obtaining the ohmic contact electrode; and then processing the UV photodetector epitaxial wafer;

performing photolithography through mask alignment on the ohmic contact electrode metal on the insulating layer, and on the side surface of the insulating layer and the ohmic contact electrode, as well as on the undoped N polar plane $Al_xGa_{1-x}N$ layer, thus obtaining the pattern of the Schottky contact electrode; and then covering the pattern of the Schottky contact electrode sufficiently uniformly with a Schottky contact electrode material, heating, and standing to shape to obtain the solar-blind AlGaN UV photodetector.

Further, the Schottky contact electrode is made of a two-dimensional MXene material, and the insulating layer is made of $Al_2O_3$.

Further, photolithography is performed on the processed UV photodetector epitaxial wafer, the thickness of the photoresist being 0.2-0.7 μm, the exposure time being 1-4 s, the development time being 45-95 s.

Further, the depth of the groove is 1-2.5 μm.

Further, the close-packed Si (111) surface of the silicon substrate is taken as the epitaxial surface; and (0001) is taken as the epitaxial direction for the undoped N-polar plane AlN buffer layer, the carbon-doped N-polar plane AlN layer, the carbon-doped N-polar plane composition-graded $Al_yGa_{1-y}N$ layer, and the undoped N-polar plane $Al_xGa_{1-x}N$ layer.

The present invention has the following beneficial effects relative to the prior art:

1. In the preparation method provided by the present invention, a novel two-dimensional MXene material is used in the design of the Schottky contact electrode structure, and the responsivity and detectivity can be increased by improving the electron mobility.

2. The present invention uses the group III nitride represented by AlGaN as the basic material of the UV photodetector; compared with the traditional Si chip, the group III nitride has more excellent material properties, and enables better realization of miniaturization and integration of the device in shorter wavelength applications.

3. The present invention uses the N-polar plane group III nitride as the base material of the device, which can effectively enhance the high-temperature thermal stability of the AlGaN material compared to the traditional metal polar plane group III nitride, making the device easier to manufacture, enhancing the separation and transmission of photogenerated electrons on the surface, allowing easy preparation of high-performance solar-blind UV detectors.

4. The present invention designs the structure of the $Al_2O_3$ insulating layer, which effectively overcomes the disadvantage of MXene being easily oxidized in the process of preparing electrodes at high temperatures, and enables MXene to be used as the Schottky electrode material to modify the AlGaN-based UV photodetectors.

5. In the present invention, the Si material that is most commonly used in the semiconductor industry is selected as the epitaxial substrate of the device, which is easy to realize the commercial integration application of the device.

BRIEF DESCRIPTION OF THE DRAWINGS

In order to more clearly illustrate the examples of the present invention or the technical solutions in the prior art, the drawings that need to be used in the description of the examples or the prior art will be briefly introduced below. Obviously, these drawings are only some examples of the present invention; for those of ordinary skill in the art, other drawings can be obtained based on the structures shown in these drawings without creative efforts.

FIG. 1:

1. Silicon substrate; 2. undoped N-polar plane AlN buffer layer; 3. carbon-doped N-polar plane AlN layer; 4. carbon-doped N-polar plane composition-graded $Al_yGa_{1-y}N$ layer; 5. undoped N-polar plane $Al_xGa_{1-x}N$ layer; 6. $SiN_z$ passivation layer; 7. insulating layer; 8. ohmic contact electrode; and 9. Schottky contact electrode.

DETAILED DESCRIPTION OF THE EMBODIMENTS

In order to make the objects, technical solutions, and advantages of the examples of the present invention clearer, the technical solutions in the examples of the present invention will be described clearly and completely in combination with the drawings in the examples of the present invention. Obviously, the described examples are some, but not all, examples of the present invention. All other examples obtained by those of ordinary skill in the art according to the examples of the present invention without creative efforts shall fall within the scope of protection of the present invention. It should be understood that the described specific examples are only used to explain, but not to limit, the present application.

Example 1

Figure 1:
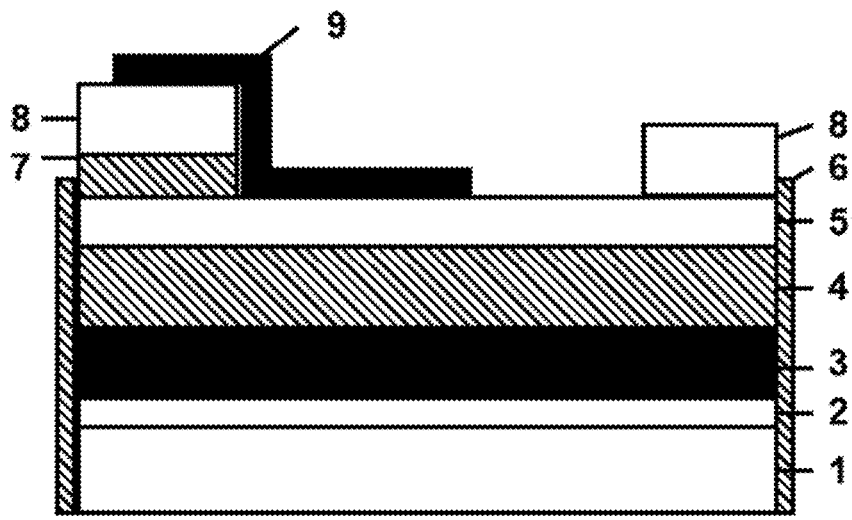
FIG. 1 shows a schematic structure of the solar-blind AlGaN UV photodetector according to an example of the present invention.

The present example provides a method for preparing the solar-blind AlGaN UV photodetector, which comprises the following steps:

(1) as shown in FIG. 1, growing the following layers sequentially on a silicon substrate 1: an undoped N-polar plane AlN buffer layer 2, a carbon-doped N-polar plane AlN layer 3, a carbon-doped N-polar plane composition-graded $Al_yGa_{1-y}N$ layer 4, and an undoped N-polar plane $Al_xGa_{1-x}N$ layer (film) 5, thus obtaining a UV photodetector epitaxial wafer;

(2) placing the AlGaN UV photodetector epitaxial wafer obtained in step (1) sequentially in acetone, deionized water, and absolute ethanol for ultrasonic treatment, taking out to clean with deionized water, and then blowing dry with hot high-purity nitrogen;

(3) preparation of a mesa isolation pattern—preparation of an insulating mesa isolation pattern by performing photolithography on the AlGaN rectifier epitaxial wafer obtained in step (2): applying photoresist uniformly on the AlGaN rectifier epitaxial wafer obtained in step (2) by spin coating, pre-drying the photoresist-coated AlGaN rectifier epitaxial wafer, then placing the wafer in a photolithography machine for exposure, and finally immersing the exposed epitaxial wafer in a developer for development, and cleaning;

(4) mesa isolation: performing reactive ion etching on the AlGaN UV photodetector epitaxial wafer after photolithography—etching along the mesa isolation pattern in the AlGaN UV photodetector epitaxial wafer to get a groove, thus obtaining separated and insulated bosses, and cleaning;

(5) preparation of a mesa isolation passivation layer: placing the AlGaN UV photodetector epitaxial wafer obtained in step (4) into a plasma-assisted chemical vapor deposition device, heating up, vacuuming to a high degree, then feeding carrier gas and reaction gas, and then depositing a $SiN_z$ passivation layer 6 in the etched groove of the AlGaN UV photodetector epitaxial wafer;

(6) etching the exposed $SiN_z$ away by a wet etching method, immersing the AlGaN UV photodetector epitaxial wafer in a photoresist-removing solution to remove the photoresist, rinsing with deionized water, removing the residual photoresist and $SiN_z$ on the surface of the AlGaN UV photodetector epitaxial wafer by ultrasonic treatment with acetone, then washing with deionized water, and then blowing dry with hot high-purity nitrogen;

(7) preparation of an electrode pattern on the insulating layer by performing photolithography on the AlGaN rectifier epitaxial wafer obtained in step (6): aligning the AlGaN epitaxial wafer through the alignment marks in the mask, and repeating the process of step (3);

(8) preparation of an insulating layer on the AlGaN rectifier epitaxial wafer: placing the AlGaN UV photodetector epitaxial wafer with the insulating layer pattern obtained by photolithography and development in step (7) into an electron beam evaporation device, vacuuming the evaporation cavity, then evaporation-depositing the $Al_2O_3$ insulating layer 7, and then annealing the AlGaN UV photodetector epitaxial wafer;

(9) immersing the AlGaN UV photodetector epitaxial wafer in a photoresist-removing solution to remove the photoresist, rinsing with deionized water, removing the residual photoresist and evaporation-deposited metal on the surface of the AlGaN UV photodetector epitaxial wafer by ultrasonic treatment with acetone, then washing with deionized water, and then blowing dry with hot high-purity nitrogen;

(10) aligning the AlGaN epitaxial wafer through the alignment marks in the mask, repeating the process of step (3) to perform photolithography and development at the corresponding position to obtain the pattern of the ohmic contact electrode of the device, and cleaning;

(11) preparation of an ohmic contact electrode on the AlGaN rectifier epitaxial wafer: placing the AlGaN rectifier epitaxial wafer with the pattern of the ohmic contact electrode obtained by photolithography and development in step (10) into the electron beam evaporation device, and repeating the process of step (8) to evaporation-deposit the ohmic contact electrode metal 8 on the AlGaN UV photodetector epitaxial wafer;

(12) repeating the process of step (9) to remove the photoresist and evaporation-deposited metal remaining on the surface of the AlGaN epitaxial wafer by immersing in a photoresist-removing solution for ultrasonic cleaning;

(13) aligning the AlGaN epitaxial wafer through the alignment marks in the mask, repeating the process of step (3) to perform photolithography and development at the corresponding position to obtain the pattern of the Schottky contact electrode of the device, and cleaning; and

(14) preparation of a Schottky contact electrode on the AlGaN rectifier epitaxial wafer: placing the AlGaN rectifier epitaxial wafer with the pattern of the Schottky contact electrode obtained by photolithography and development in step (13) under a cover glass, dropping droplets of $Ti_3C_2T_x$ into the gap, sucking the droplets on the other side with filter paper to make MXene sufficiently uniformly cover the surface of the AlGaN UV photodetector epitaxial wafer, then sucking the excess $Ti_3C_2T_x$ solution away with filter paper, and then heating, and standing to shape to obtain a Schottky contact electrode 9, thus finally obtaining the solar-blind AlGaN UV photodetector.

In step (1), the close-packed (111) surface of the silicon substrate is taken as the epitaxial surface; and (0001) is taken as the epitaxial direction for the undoped N-polar plane AlN buffer layer, the carbon-doped N-polar plane AlN layer, the carbon-doped N-polar plane composition-graded $Al_yGa_{1-y}N$ layer, and the undoped N-polar plane $Al_xGa_{1-x}N$ film;

in steps (2), (6) and (9), the ultrasonic treatment time is 3-15 min, respectively;

in step, the thickness of the photoresist is 0.2-0.7 μm, the exposure time is 1~4 s, and the development time is 45-95 s;

in step, the depth of the groove is 1-2.5 μm;

in steps (5) and (8), the degree of vacuum is $(1-5)\times 10^{-5}$ Pa;

in step, the immersion time is 45-30 min; and in step, the annealing temperature is 450° C. to 800° C., and the annealing time is 30-120 min.

Example 2

The present example provides a method for preparing the solar-blind AlGaN UV photodetector, which specifically comprises the following steps:

(1) as shown in FIG. 1, growing an AlGaN UV photodetector epitaxial wafer on a silicon substrate by the metal organic chemical vapor deposition technology, the wafer comprising an undoped N-polar plane AlN buffer layer 2, a carbon-doped N-polar plane AlN layer 3, a carbon-doped N-polar plane composition-graded $Al_yGa_{1-y}N$ layer 4, and an undoped N-polar plane $Al_xGa_{1-x}N$ layer 5, wherein:

the undoped N-polar plane AlN buffer layer 2 is grown on the silicon substrate 1, having a thickness of 450 nm;

the carbon-doped N-polar plane AlN layer 3 is grown on the N-polar plane AlN buffer layer 2, having a doping concentration of $2.0\times 10^{18}$ cm$^{-3}$ and a thickness of 420 nm;

the carbon-doped N-polar plane composition-graded $Al_yGa_{1-y}N$ layer 4 is grown on the carbon-doped semi-insulating N-polar AlN buffer layer 3, having a doping concentration of $8.0\times 10^{16}$ cm$^{-3}$ and a thickness of 520 nm; and the undoped N-polar plane $Al_xGa_{1-x}N$ layer 5 is grown on the semi-doped N-polar AlGaN layer 4, having a thickness of 400 nm;

(2) placing the AlGaN UV photodetector epitaxial wafer sequentially in acetone, deionized water, and absolute ethanol for ultrasonic treatment for 3 min, respectively, taking out to clean with deionized water, and then blowing dry with hot high-purity nitrogen;

(3) preparation of a mesa isolation pattern: spin-coating a positive photoresist of model RZJ304 to a thickness of 0.2 μm on the cleaned AlGaN UV photodetector epitaxial wafer, then placing the wafer on a hot stage to pre-dry for 90 s, and then placing it in a photolithography machine to align through the alignment marks in the mask, with the size of the developing area being 2 mm×1 mm; then exposing for 15 s, and immersing the exposed epitaxial wafer in a positive developer of model RZX3038 for 50 s; and finally taking out the developed epitaxial wafer, rinsing with deionized water, blowing dry with hot high-purity nitrogen, and placing on a hot stage to bake for hardening the film for 90 s;

(4) etching of a mesa isolation pattern: placing the AlGaN UV photodetector epitaxial wafer after photolithography in a reactive ion etching machine to perform reactive ion etching on the isolating layer pattern exposed by the photolithography, thus obtaining a groove of 2 μm in depth corresponding to the pattern; and then rinsing the surface of the epitaxial wafer with deionized water, and blowing it dry with hot nitrogen;

(5) preparation of a mesa isolation passivation layer: placing the AlGaN UV photodetector epitaxial wafer in a plasma-assisted chemical vapor deposition device, heating up to 800° C., then vacuuming the cavity to 5× $10^{-5}$ Pa, and then depositing a $SiN_z$ (z=1.33-1.5) passivation layer 6 in the etched groove of the AlGaN UV photodetector epitaxial wafer for 120 min;

(6) etching the exposed $SiN_z$ passivation layer away by the wet etching method, and taking out to rinse with deionized water; then immersing the AlGaN UV photodetector epitaxial wafer with the prepared insulating pattern in a photoresist-removing solution for 100 min, and taking out to rinse with deionized water; and then placing in acetone for ultrasonic treatment for 15 min, taking out to rinse with deionized water, and blowing dry with hot nitrogen;

(7) preparation of an insulating layer pattern: aligning the AlGaN UV photodetector epitaxial wafer through the alignment marks in the mask, and repeating the photolithography process in step (3) to perform photolithography and development at the corresponding position, thus exposing a pattern area, with a size of 0.3 mm×1 mm, of the insulating layer of the device on the AlGaN UV photodetector epitaxial wafer;

(8) preparation of an insulating layer on the AlGaN UV photodetector epitaxial wafer after photolithography: placing the AlGaN UV photodetector epitaxial wafer with the prepared insulating layer pattern in the electron beam evaporation device, vacuuming the cavity to $1 \times 10^{-5}$ Pa, and then evaporation-depositing the material $Al_2O_3$ of the insulating layer 7 to a thickness of 250 nm;

(9) immersing the AlGaN UV photodetector epitaxial wafer with the prepared insulating layer in a photoresist-removing solution for 100 min, and taking out to rinse with deionized water; and then placing in acetone for ultrasonic treatment for 15 min, taking out to rinse with deionized water, and blowing dry with hot nitrogen;

(10) preparation of a pattern of the ohmic contact electrode: aligning the AlGaN UV photodetector epitaxial wafer through the alignment marks in the mask, and repeating the photolithography process in step (3) to perform photolithography and development at the corresponding position, thus exposing a pattern area, with a size of 2 mm×0.2 mm×1 mm, of the ohmic contact electrodes of the device respectively on the left and right sides of the etched mesa on the AlGaN UV photodetector epitaxial wafer;

(11) preparation of an ohmic contact electrode on the AlGaN UV photodetector epitaxial wafer after photolithography: placing the AlGaN UV photodetector epitaxial wafer with the prepared pattern of the ohmic contact electrode in the electron beam evaporation device, vacuuming the cavity to $1 \times 10^{-5}$ Pa, and then evaporation-depositing sequentially the ohmic contact electrode materials Ti/Al/Ni/Au to a thickness of 100 nm;

(12) repeating the process of step (9) to remove the photoresist and evaporation-deposited metal remaining on the surface of the AlGaN epitaxial wafer by immersing in a photoresist-removing solution for ultrasonic cleaning;

(13) preparation of a pattern of the Schottky contact electrode: aligning the AlGaN UV photodetector epitaxial wafer through the alignment marks in the mask, and repeating the photolithography process in step (3) to perform photolithography and development at the corresponding position on the insulating layer pattern, thus exposing a pattern area, with a size of 1.6 mm×1 mm, of the Schottky contact electrode of the device on the AlGaN UV photodetector epitaxial wafer; and

(14) preparation of a Schottky contact electrode on the AlGaN UV photodetector epitaxial wafer after photolithography: pasting the AlGaN UV photodetector epitaxial wafer with the prepared pattern of the Schottky contact electrode on a glass slide, sucking a small amount of MXene sample (at a concentration of 0.1 g/mL) with a needle tube to drop on the surface of the epitaxial wafer, and fully spreading the dropped MXene with a cover glass; then placing the AlGaN UV photodetector epitaxial wafer in a vacuum oven to get dried, thus shaping the Mxene; and finally immersing the AlGaN epitaxial wafer in acetone for 50 s to remove the residual photoresist and MXene on the surface of the AlGaN epitaxial wafer, thus obtaining the solar-blind AlGaN UV photodetector.

Figure 2:
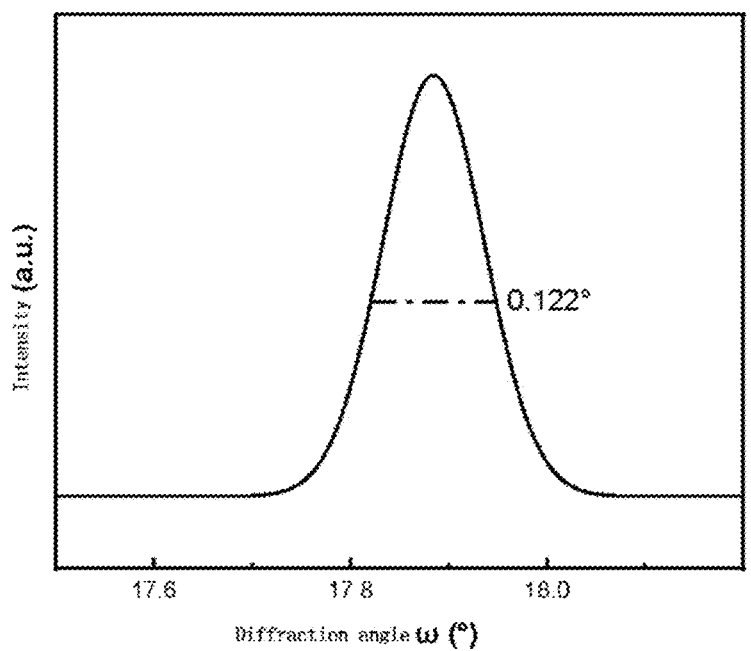
FIG. 2 shows an X-ray rocking curve of the N-polar AlGaN (0002) according to an example of the present invention.
Figure 3:
FIG. 3 shows a real photograph, taken by an optical microscope, of the N-polar plane AlGaN UV photodetector according to an example of the present invention.

The structure of the solar-blind AlGaN UV photodetector prepared in this example is shown in FIG. 1; the X-ray rocking curve of the AlGaN layer, with an FWHM (full width at half maximum) of 0.122°, is shown in FIG. 2, indicating that the crystal quality is very good; and the non-polar AlGaN UV photodetector device is shown in FIG. 3.

Example 3

The present example provides a method for preparing the solar-blind AlGaN UV photodetector, which specifically comprises the following steps:

(1) growing an AlGaN UV photodetector epitaxial wafer on a silicon substrate by the metal organic chemical vapor deposition technology, the wafer comprising an undoped N-polar plane AlN buffer layer 2, a carbon-doped N-polar plane AlN layer 3, a carbon-doped N-polar plane composition-graded $Al_yGa_{1-y}N$ layer 4, and an undoped N-polar plane $Al_xGa_{1-x}N$ layer 5, wherein:

the undoped N-polar plane AlN buffer layer 2 is grown on the silicon substrate 1, having a thickness of 500 nm;

the carbon-doped N-polar plane AlN layer 3 is grown on the N-polar plane AlN buffer layer 2, having a doping concentration of $3.0\times10^{18}$ cm$^{-3}$ and a thickness of 440 nm;

the carbon-doped N-polar plane composition-graded $Al_yGa_{1-y}N$ layer 4 is grown on the carbon-doped semi-insulating N-polar AlN buffer layer 3, having a doping concentration of $1.0\times10^{17}$ cm$^{-3}$ and a thickness of 530 nm; and the undoped N-polar plane $Al_xGa_{1-x}N$ layer 5 is grown on the semi-doped N-polar AlGaN layer 4, having a thickness of 450 nm;

(2) placing the AlGaN UV photodetector epitaxial wafer sequentially in acetone, deionized water, and absolute ethanol for ultrasonic treatment for 3 min, respectively, taking out to clean with deionized water, and then blowing dry with hot high-purity nitrogen;

(3) preparation of a mesa isolation pattern: spin-coating a positive photoresist of model RZJ304 to a thickness of 0.3 μm on the cleaned AlGaN UV photodetector epitaxial wafer, then placing the wafer on a hot stage to pre-dry for 90 s, and then placing it in a photolithography machine to align through the alignment marks in the mask, with the size of the developing area being 2 mm×1 mm; then exposing for 15 s, and immersing the exposed epitaxial wafer in a positive developer of model RZX3038 for 50 s; and finally taking out the developed epitaxial wafer, rinsing with deionized water, blowing dry with hot high-purity nitrogen, and placing on a hot stage to bake for hardening the film for 90 s;

(4) etching of a mesa isolation pattern: placing the AlGaN UV photodetector epitaxial wafer after photolithography in a reactive ion etching machine to perform reactive ion etching on the isolating layer pattern exposed by the photolithography, thus obtaining a groove of 2.5 μm in depth corresponding to the pattern; and then rinsing the surface of the epitaxial wafer with deionized water, and blowing it dry with hot nitrogen;

(5) preparation of a mesa isolation passivation layer: placing the AlGaN UV photodetector epitaxial wafer in a plasma-assisted chemical vapor deposition device, heating up to 800° C., then vacuuming the cavity to $5\times10^{-5}$ Pa, and then depositing a $SiN_z$ (z=1.33-1.5) passivation layer 6 in the etched groove of the AlGaN UV photodetector epitaxial wafer for 120 min;

(6) etching the exposed $SiN_z$ passivation layer away by the wet etching method, and taking out to rinse with deionized water; then immersing the AlGaN UV photodetector epitaxial wafer with the prepared isolation pattern in a photoresist-removing solution for 100 min, and taking out to rinse with deionized water; and then placing in acetone for ultrasonic treatment for 15 min, taking out to rinse with deionized water, and blowing dry with hot nitrogen;

(7) preparation of an insulating layer pattern: aligning the AlGaN UV photodetector epitaxial wafer through the alignment marks in the mask, and repeating the photolithography process in step (3) to perform photolithography and development at the corresponding position, thus exposing a pattern area, with a size of 0.3 mm×1 mm, of the insulating layer of the device on the AlGaN UV photodetector epitaxial wafer;

(8) preparation of an insulating layer on the AlGaN UV photodetector epitaxial wafer after photolithography: placing the AlGaN UV photodetector epitaxial wafer with the prepared insulating layer pattern in the electron beam evaporation device, vacuuming the cavity to $1\times10^{-5}$ Pa, and then evaporation-depositing the material $Al_2O_3$ of the insulating layer 7 to a thickness of 220 nm;

(9) immersing the AlGaN UV photodetector epitaxial wafer with the prepared insulating layer in a photoresist-removing solution for 100 min, and taking out to rinse with deionized water; and then placing in acetone for ultrasonic treatment for 15 min, taking out to rinse with deionized water, and blowing dry with hot nitrogen;

(10) preparation of a pattern of the ohmic contact electrode: aligning the AlGaN UV photodetector epitaxial wafer through the alignment marks in the mask, and repeating the photolithography process in step (3) to perform photolithography and development at the corresponding position, thus exposing a pattern area, with a size of 2 mm×0.2 mm×1 mm, of the ohmic contact electrodes of the device respectively on the left and right sides of the etched mesa on the AlGaN UV photodetector epitaxial wafer;

(11) preparation of an ohmic contact electrode 8 on the AlGaN UV photodetector epitaxial wafer after photolithography: placing the AlGaN UV photodetector epitaxial wafer with the prepared pattern of the ohmic contact electrode in the electron beam evaporation device, vacuuming the cavity to $1\times10^{-5}$ Pa, and then evaporation-depositing sequentially the ohmic contact electrode materials Ti/Al/Ni/Au to a thickness of 120 nm;

(12) repeating the process of step (9) to remove the photoresist and evaporation-deposited metal remaining on the surface of the AlGaN epitaxial wafer by immersing in a photoresist-removing solution for ultrasonic cleaning;

(13) preparation of a pattern of the Schottky contact electrode: aligning the AlGaN UV photodetector epitaxial wafer through the alignment marks in the mask, and repeating the photolithography process in step (3) to perform photolithography and development at the corresponding position on the insulating layer pattern, thus exposing a pattern area, with a size of 1.6 mm×1 mm, of the Schottky contact electrode of the device on the AlGaN UV photodetector epitaxial wafer; and

(14) preparation of a Schottky contact electrode 9 on the AlGaN UV photodetector epitaxial wafer after photolithography: pasting the AlGaN UV photodetector epitaxial wafer with the prepared pattern of the Schottky contact electrode on a glass slide, sucking a small amount of MXene sample (at a concentration of 0.05 g/mL) with a needle tube to drop on the surface of the epitaxial wafer, and fully spreading the dropped MXene with a cover glass; then placing the AlGaN UV photodetector epitaxial wafer in a vacuum oven to get dried, thus shaping the Mxene; and finally immersing the AlGaN epitaxial wafer in acetone for 50 s to remove the residual photoresist and MXene on the surface of the AlGaN epitaxial wafer, thus obtaining the solar-blind AlGaN UV photodetector.

The test results of the solar-blind AlGaN UV photodetector prepared in this example are similar to those in Example 2, and are not repeated here.

Example 4

The present example provides a method for preparing the solar-blind AlGaN UV photodetector, which specifically comprises the following steps:

(1) growing an AlGaN UV photodetector epitaxial wafer on a silicon substrate by the metal organic chemical vapor deposition technology, the wafer comprising an undoped N-polar plane AlN buffer layer 2, a carbon-doped N-polar plane AlN layer 3, a carbon-doped N-polar plane composition-graded $Al_yGa_{1-y}N$ layer 4, and an undoped N-polar plane $Al_xGa_{1-x}N$ layer 5, wherein:

the undoped N-polar plane AlN buffer layer 2 is grown on the silicon substrate 1, having a thickness of 350 nm;

the carbon-doped N-polar plane AlN layer 3 is grown on the N-polar plane AlN buffer layer 2, having a doping concentration of $8 \times 10^{17}$ $cm^{-3}$ and a thickness of 380 nm;

the carbon-doped N-polar plane composition-graded $Al_yGa_{1-y}N$ layer 4 is grown on the carbon-doped semi-insulating N-polar AlN buffer layer 3, having a doping concentration of $6.0.0 \times 10^{16}$ $cm^{-3}$ and a thickness of 480 nm; and the undoped N-polar plane $Al_xGa_{1-x}N$ layer 5 is grown on the semi-doped N-polar AlGaN layer 4, having a thickness of 370 nm;

(2) placing the AlGaN UV photodetector epitaxial wafer sequentially in acetone, deionized water, and absolute ethanol for ultrasonic treatment for 3 min, respectively, taking out to clean with deionized water, and then blowing dry with hot high-purity nitrogen;

(3) preparation of a mesa isolation pattern: spin-coating a positive photoresist of model RZJ304 to a thickness of 0.4 μm on the cleaned AlGaN UV photodetector epitaxial wafer, then placing the wafer on a hot stage to pre-dry for 90 s, and then placing it in a photolithography machine to align through the alignment marks in the mask, with the size of the developing area being 2 mm×1 mm; then exposing for 15 s, and immersing the exposed epitaxial wafer in a positive developer of model RZX3038 for 50 s; and finally taking out the developed epitaxial wafer, rinsing with deionized water, blowing dry with hot high-purity nitrogen, and placing on a hot stage to bake for hardening the film for 90 s;

(4) etching of a mesa isolation pattern: placing the AlGaN UV photodetector epitaxial wafer after photolithography in a reactive ion etching machine to perform reactive ion etching on the isolating layer pattern exposed by the photolithography, thus obtaining a groove of 3 μm in depth corresponding to the pattern; and then rinsing the surface of the epitaxial wafer with deionized water, and blowing it dry with hot nitrogen;

(5) preparation of a mesa isolation passivation layer: placing the AlGaN UV photodetector epitaxial wafer in a plasma-assisted chemical vapor deposition device, heating up to 800° C., then vacuuming the cavity to $5 \times 10^{-5}$ Pa, and then depositing a $SiN_z$ (z=1.33-1.5) passivation layer in the etched groove of the AlGaN UV photodetector epitaxial wafer for 120 min;

(6) etching the exposed $SiN_z$ passivation layer away by the wet etching method, and taking out to rinse with deionized water; then immersing the AlGaN UV photodetector epitaxial wafer with the prepared isolation pattern in a photoresist-removing solution for 100 min, and taking out to rinse with deionized water; and then placing in acetone for ultrasonic treatment for 15 min, taking out to rinse with deionized water, and blowing dry with hot nitrogen;

(7) preparation of an insulating layer pattern: aligning the AlGaN UV photodetector epitaxial wafer through the alignment marks in the mask, and repeating the photolithography process in step (3) to perform photolithography and development at the corresponding position, thus exposing a pattern area, with a size of 0.3 mm×1 mm, of the insulating layer of the device on the AlGaN UV photodetector epitaxial wafer;

(8) preparation of an insulating layer on the AlGaN UV photodetector epitaxial wafer after photolithography: placing the AlGaN UV photodetector epitaxial wafer with the prepared insulating layer pattern in the electron beam evaporation device, vacuuming the cavity to $1 \times 10^{-5}$ Pa, and then evaporation-depositing the insulating layer material $Al_2O_3$ to a thickness of 300 nm;

(9) immersing the AlGaN UV photodetector epitaxial wafer with the prepared insulating layer in a photoresist-removing solution for 100 min, and taking out to rinse with deionized water; and then placing in acetone for ultrasonic treatment for 15 min, taking out to rinse with deionized water, and blowing dry with hot nitrogen;

(10) preparation of a pattern of the ohmic contact electrode: aligning the AlGaN UV photodetector epitaxial wafer through the alignment marks in the mask, and repeating the photolithography process in step (3) to perform photolithography and development at the corresponding position, thus exposing a pattern area, with a size of 2 mm×0.2 mm×1 mm, of the ohmic contact electrodes of the device respectively on the left and right sides of the etched mesa on the AlGaN UV photodetector epitaxial wafer;

(11) preparation of an ohmic contact electrode on the AlGaN UV photodetector epitaxial wafer after photolithography: placing the AlGaN UV photodetector epitaxial wafer with the prepared pattern of the ohmic contact electrode in the electron beam evaporation device, vacuuming the cavity to $1 \times 10^{-5}$ Pa, and then evaporation-depositing sequentially the ohmic contact electrode materials Ti/Al/Ni/Au to a thickness of 150 nm;

(12) repeating the process of step (9) to remove the photoresist and evaporation-deposited metal remaining on the surface of the AlGaN epitaxial wafer by immersing in a photoresist-removing solution for ultrasonic cleaning;

(13) preparation of a pattern of the Schottky contact electrode: aligning the AlGaN UV photodetector epitaxial wafer through the alignment marks in the mask, and repeating the photolithography process in step (3) to perform photolithography and development at the corresponding position on the insulating layer pattern, thus exposing a pattern area, with a size of 1.6 mm×1 mm, of the Schottky contact electrode of the device on the AlGaN UV photodetector epitaxial wafer; and

(14) preparation of a Schottky contact electrode on the AlGaN UV photodetector epitaxial wafer after photolithography: pasting the AlGaN UV photodetector epitaxial wafer with the prepared pattern of the Schottky contact electrode on a glass slide, sucking a small amount of MXene sample (at a concentration of 0.2 g/mL) with a needle tube to drop on the surface of the epitaxial wafer, and fully spreading the dropped MXene with a cover glass; then placing the AlGaN UV photodetector epitaxial wafer in a vacuum oven to get dried, thus shaping the Mxene; and finally immersing the AlGaN epitaxial wafer in acetone for 50 s to remove the residual photoresist and MXene on the surface of the AlGaN epitaxial wafer, thus obtaining the solar-blind AlGaN UV photodetector.

The test results of the solar-blind AlGaN UV photodetector prepared in this example are similar to those in Example 2, and are not repeated here.

To sum up, the present invention discloses the following method for preparing the solar-blind AlGaN UV photodetector: sequentially growing the following layers on a silicon substrate: an undoped N-polar plane AlN buffer layer, a carbon-doped N-polar plane AlN layer, a carbon-doped N-polar plane composition-graded $Al_yGa_{1-y}N$ layer, and an undoped N-polar plane $Al_xGa_{1-x}N$ layer, thus obtaining a UV photodetector epitaxial wafer; preparing a groove of the isolating layer pattern on the UV photodetector epitaxial wafer, and depositing an insulating $Al_2O_3$ layer in the groove; preparing a pattern of the ohmic contact electrode, and depositing an ohmic contact electrode on the $Al_2O_3$ layer and the epitaxial wafer layer; then preparing a pattern of the Schottky contact electrode on the ohmic contact electrode on the insulating layer and on the epitaxial wafer, and preparing a two-dimensional ultra-thin $Ti_3C_2T_x$ Schottky contact electrode on the ohmic contact electrode on the insulating layer and on the epitaxial wafer; and finally subjecting the AlGaN UV photodetector epitaxial wafer to the mesa isolation treatment. The present invention realizes the preparation of the high-performance AlGaN UV photodetector, and improves the responsivity and detectivity of the AlGaN UV photodetector in the UV solar-blind band.

The above is only a preferred example of the present invention patent, but the scope of protection of the present invention patent is not limited thereto. Equivalent substitution or alteration made by any of those skilled in the art within the scope disclosed by the present invention patent according to the technical solution and inventive concept of the present invention patent all falls within the scope of protection of the present invention patent.

The invention claimed is:

1. A solar-blind AlGaN ultraviolet (UV) photodetector, characterized in that: it comprises an UV photodetector epitaxial wafer, and also comprises an insulating layer, an ohmic contact electrode, and a Schottky contact electrode arranged on the UV photodetector epitaxial wafer, as well as a $SiN_z$ passivation layer arranged on both sides of the UV photodetector epitaxial wafer, where z=1.33-1.5; wherein:
the UV photodetector epitaxial wafer comprises the following layers grown sequentially on a silicon substrate: an undoped N-polar plane AlN buffer layer, a carbon-doped N-polar plane AlN layer, a carbon-doped N-polar plane composition-graded $Al_yGa_{1-y}N$ layer, and an undoped N-polar plane $Al_xGa_{1-x}N$ layer, where x=0.5-0.8, and y=0.75-0.95; and
the insulating layer is arranged on one side of the undoped N-polar plane $Al_xGa_{1-x}N$ layer; the ohmic contact electrode is arranged on the insulating layer, and also oppositely on the upper surface of the undoped N-polar plane $Al_xGa_{1-x}N$ layer; and the Schottky contact electrode is arranged on the ohmic contact electrode, on the side surface of the insulating layer and the ohmic contact electrode, and on the undoped N-polar plane $Al_xGa_{1-x}N$ layer.

2. The solar-blind AlGaN UV photodetector according to claim 1, characterized in that: the Schottky contact electrode is made of a two-dimensional MXene material, and the insulating layer is made of $Al_2O_3$.

3. The solar-blind AlGaN UV photodetector according to claim 1, characterized in that: the thickness of the insulating layer is 200-300 nm, and the thickness of the ohmic contact electrode is 100-150 nm.

4. The solar-blind AlGaN UV photodetector according to claim 1, characterized in that: the insulating layer is higher than the upper surface of the undoped N-polar plane $Al_xGa_{1-x}N$ layer.

5. The solar-blind AlGaN UV photodetector according to claim 1, characterized in that: the close-packed (111) surface of the silicon substrate is taken as the epitaxial surface; and (0001) is taken as the epitaxial direction for the undoped N-polar plane AlN buffer layer, the carbon-doped N-polar plane AlN layer, the carbon-doped N-polar plane composition-graded $Al_yGa_{1-y}N$ layer, and the undoped N-polar plane $Al_xGa_{1-x}N$ layer.

6. A method for preparing the solar-blind AlGaN UV photodetector, characterized in that the method comprises the following steps:
growing the following layers sequentially on the silicon substrate: an undoped N-polar plane AlN buffer layer, a carbon-doped N-polar plane AlN layer, a carbon-doped N-polar plane composition-graded $Al_yGa_{1-y}N$ layer, and an undoped N-polar plane $Al_xGa_{1-x}N$ layer, where x=0.5-0.8, and y=0.75-0.95, thus obtaining an UV photodetector epitaxial wafer, and then processing the wafer;
performing photolithography on the processed UV photodetector epitaxial wafer to obtain an isolation pattern, then etching the UV photodetector epitaxial wafer to obtain a groove along the isolation pattern, and then placing the UV photodetector epitaxial wafer in a plasma-assisted chemical vapor deposition device to deposit a $SiN_z$ passivation layer in the groove, where z=1.33-1.5;
etching the exposed $SiN_z$ on the UV photodetector epitaxial wafer away by a wet etching method, and then processing the wafer;
performing photolithography on one side of the undoped N-polar plane $Al_xGa_{1-x}N$ layer through mask alignment to obtain an insulating layer pattern thereon, then placing the UV photodetector epitaxial wafer prepared in an electron beam evaporation device to evaporation-deposit an isolating layer thereon, and then processing the UV photodetector epitaxial wafer with the prepared insulating layer;
performing photolithography on the insulating layer and oppositely on the undoped N-polar plane $Al_xGa_{1-x}N$ layer through mask alignment, respectively, thus obtaining the pattern of the ohmic contact electrode; then placing the UV photodetector epitaxial wafer in the electron beam evaporation device to evaporation-deposit an ohmic contact electrode metal, thus obtaining the ohmic contact electrode; and then processing the UV photodetector epitaxial wafer; and
performing photolithography through mask alignment on the ohmic contact electrode metal on the insulating layer, and on the side surface of the insulating layer and the ohmic contact electrode, as well as on the undoped N polar plane $Al_xGa_{1-x}N$ layer, thus obtaining the pattern of the Schottky contact electrode; and then covering the pattern of the Schottky contact electrode sufficiently uniformly with a Schottky contact electrode material, heating, and standing to shape to obtain the solar-blind AlGaN UV photodetector.

7. The preparation method according to claim 6, characterized in that: the Schottky contact electrode is made of a two-dimensional MXene material, and the insulating layer is made of $Al_2O_3$.

8. The preparation method according to claim 6, characterized in that: photolithography is performed on the processed UV photodetector epitaxial wafer, the thickness of a photoresist being 0.2-0.7 μm, the exposure time being 1-4 s, the development time being 45-95 s.

9. The preparation method according to claim 6, characterized in that the depth of the groove is 1-2.5 μm.

10. The preparation method according to claim 6, characterized in that: the close-packed Si(111) surface of the silicon substrate is taken as the epitaxial surface; and (0001) is taken as the epitaxial direction for the undoped N-polar plane AlN buffer layer, the carbon-doped N-polar plane AlN layer, the carbon-doped N-polar plane composition-graded $Al_yGa_{1-y}N$ layer, and the undoped N-polar plane $Al_xGa_{1-x}N$ layer.

* * * * *